(12) United States Patent
Yu et al.

(10) Patent No.: US 8,297,721 B2
(45) Date of Patent: Oct. 30, 2012

(54) SLIDE RAIL

(75) Inventors: Mo-Ming Yu, Shenzhen (CN); Xiang-Wei He, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 692 days.

(21) Appl. No.: 12/412,376

(22) Filed: Mar. 27, 2009

(65) Prior Publication Data
US 2009/0310894 A1 Dec. 17, 2009

(30) Foreign Application Priority Data

Jun. 13, 2008 (CN) .......................... 2008 1 0302135

(51) Int. Cl.
*A47B 88/04* (2006.01)
(52) U.S. Cl. ................. 312/333; 312/333.4; 312/334.47
(58) Field of Classification Search ............... 312/330.1, 312/333, 334.1, 334.4, 334.5, 334.7, 334.8, 312/334.44, 334.47, 319.1; 211/26
See application file for complete search history.

(56) References Cited

U.S. PATENT DOCUMENTS

| | | | | |
|---|---|---|---|---|
| 5,851,059 A | * | 12/1998 | Cirocco | 312/334.11 |
| 6,230,903 B1 | * | 5/2001 | Abbott | 211/26 |
| 6,431,668 B1 | * | 8/2002 | Reddicliffe | 312/334.5 |
| 2003/0141791 A1 | * | 7/2003 | Dubon et al. | 312/333 |
| 2005/0116594 A1 | * | 6/2005 | Barry et al. | 312/334.4 |
| 2008/0079342 A1 | * | 4/2008 | Peng et al. | 312/333 |

* cited by examiner

*Primary Examiner* — James O Hansen
(74) *Attorney, Agent, or Firm* — Altis Law Group, Inc.

(57) ABSTRACT

A slide rail includes an outer rail, an intermediate rail slidably received in the outer rail, a first inner rail slidably received in the intermediate rail opposite to the outer rail, a second inner rail slidably received in the intermediate rail opposite to the outer rail, a protuberance disposed on the first inner rail, a latch member connected to the second inner rail, and a releasing member connected to the outer rail. The first and second inner rails are arranged adjacent to opposite first and second ends of the outer rail. The latch member is capable of engaging with or disengaging from the protuberance. When the first inner rail slides out of the outer rail from the first end, the releasing member is configured to abut against the latch member and urge the latch member to disengage from the protuberance.

14 Claims, 18 Drawing Sheets

SLIDE RAIL

BACKGROUND

1. Technical Field

The present disclosure relates to slide rails and, more particularly, to a slide rail for mounting a server to a cabinet.

2. Description of Related Art

An ordinary slide rail for mounting a server to a rack includes an outer rail mounted to the rack, an inner rail mounted to the server, and an intermediate rail mounted between the outer and inner rails. The intermediate rail is extendable relative to the outer rail, and the inner rail is extendable relative to the intermediate rail, so that the server can be extended from the rack. Generally, the length of the server and the depth of the rack are standardized. However, non-standard servers with smaller lengths are becoming more fashionable; thus, the servers will not be compactly accommodated in the corresponding racks employing the ordinary slide rails.

DETAILED DESCRIPTION

Figure 1:
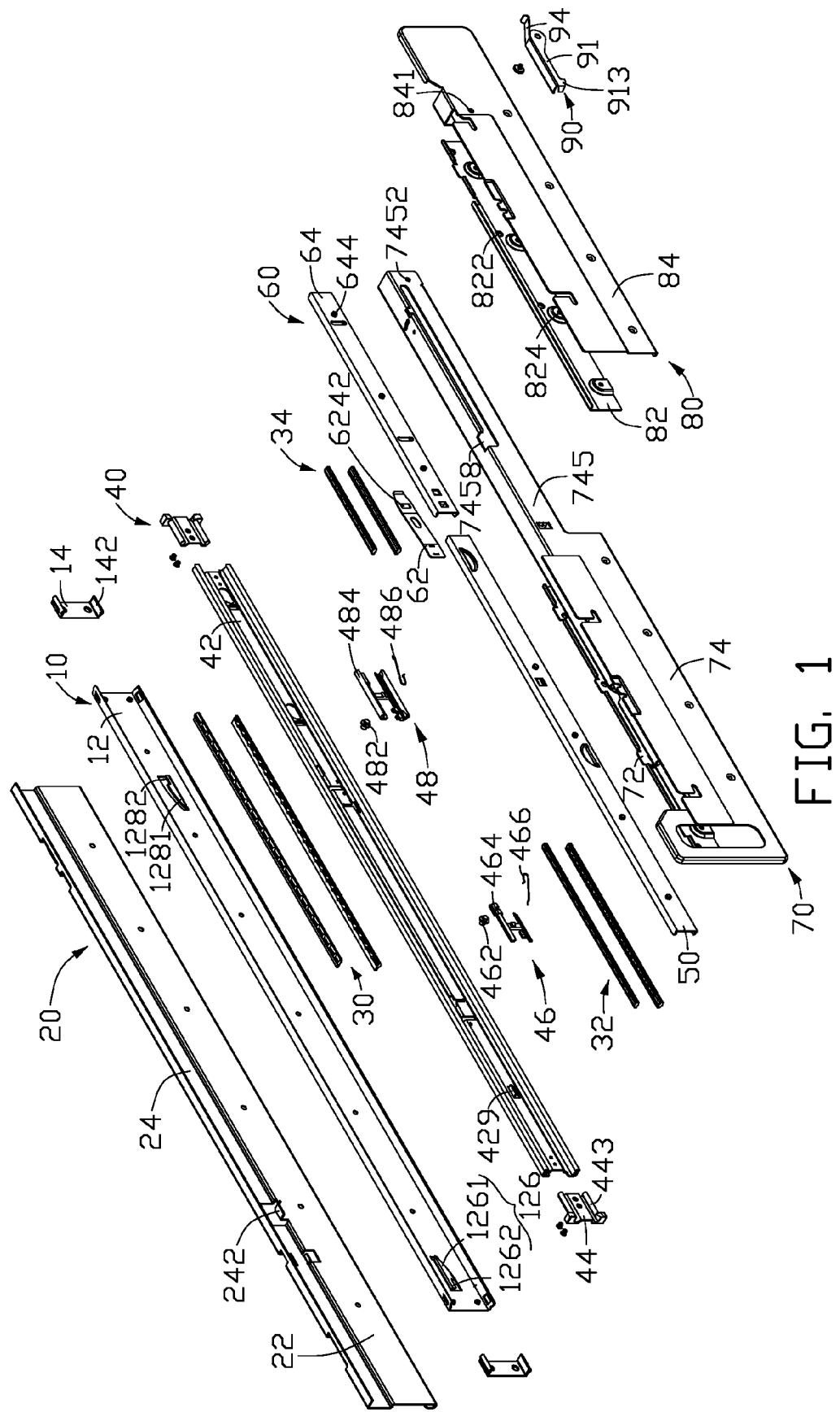
FIGS. 1 and 2 are exploded, isometric views of a first exemplary embodiment of a slide rail, but viewed from different perspectives, the slide rail includes an outer rail, an intermediate rail, a first inner rail, a second inner rail, a first connecting mechanism, a second connecting mechanism, a latch member, a first positioning mechanism, and a second positioning mechanism.
Figure 2:
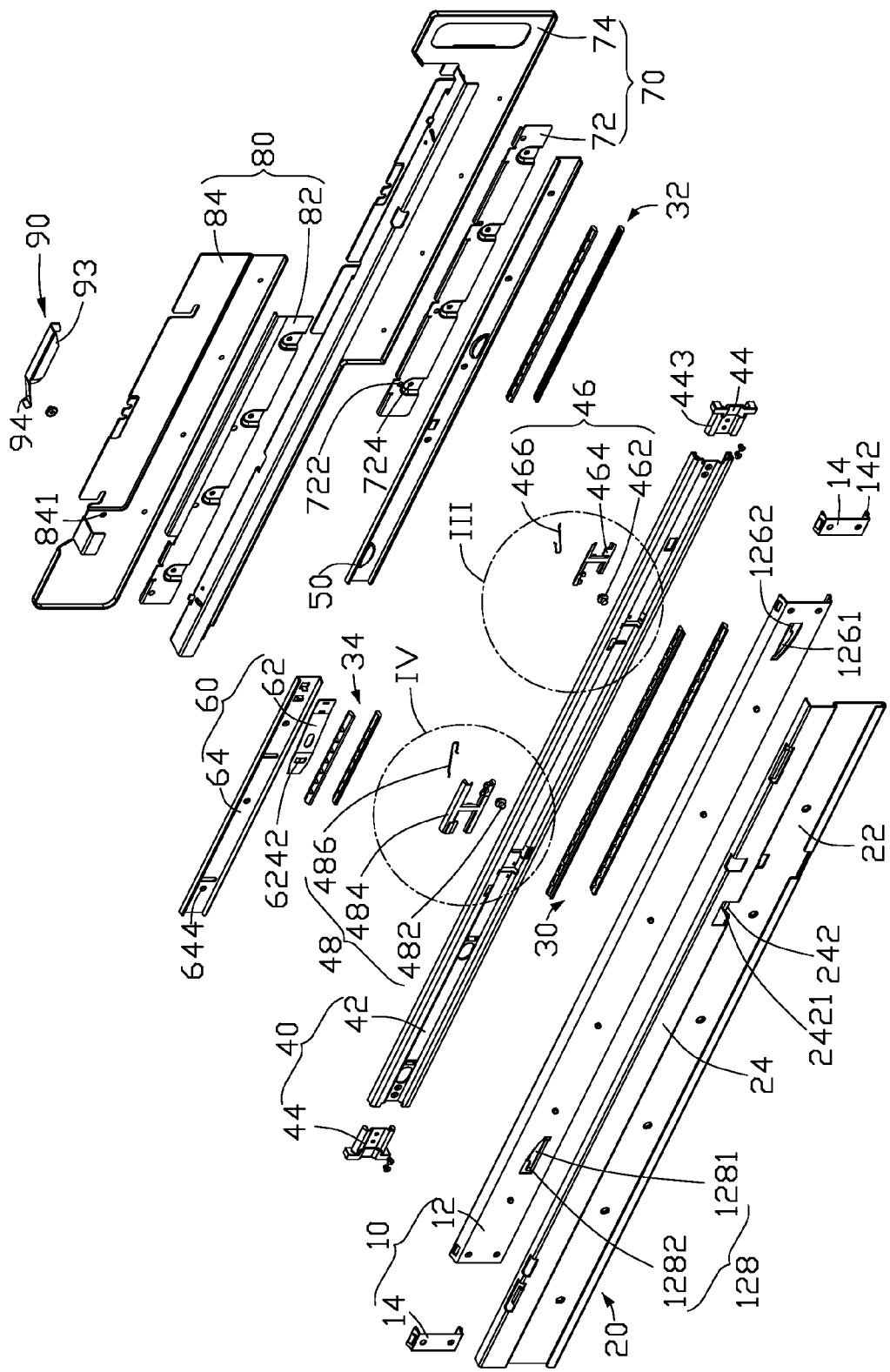
Figure 3:
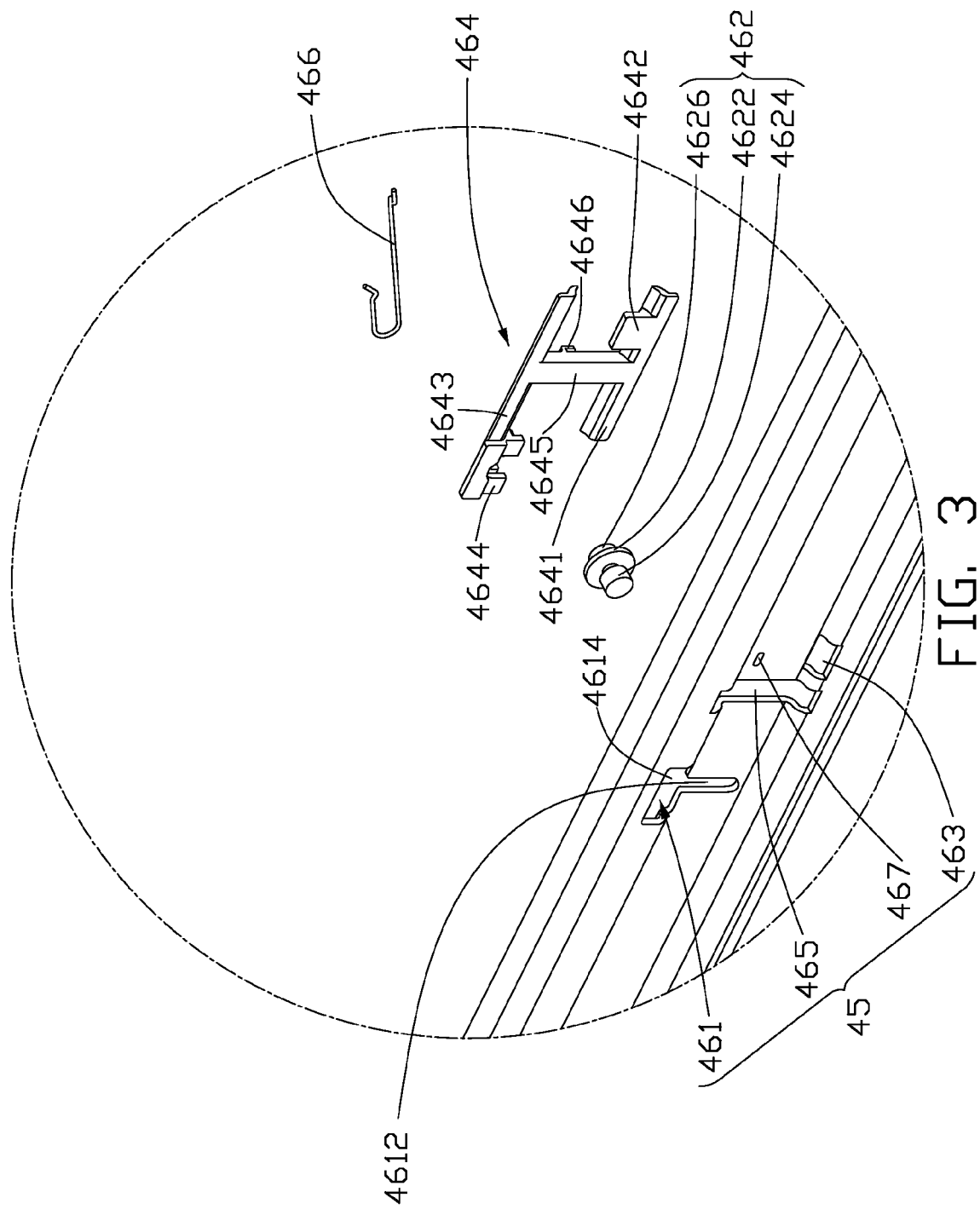
FIGS. 3 and 4 are enlarged views of the encircled portions III and IV of FIG. 2.
Figure 4:
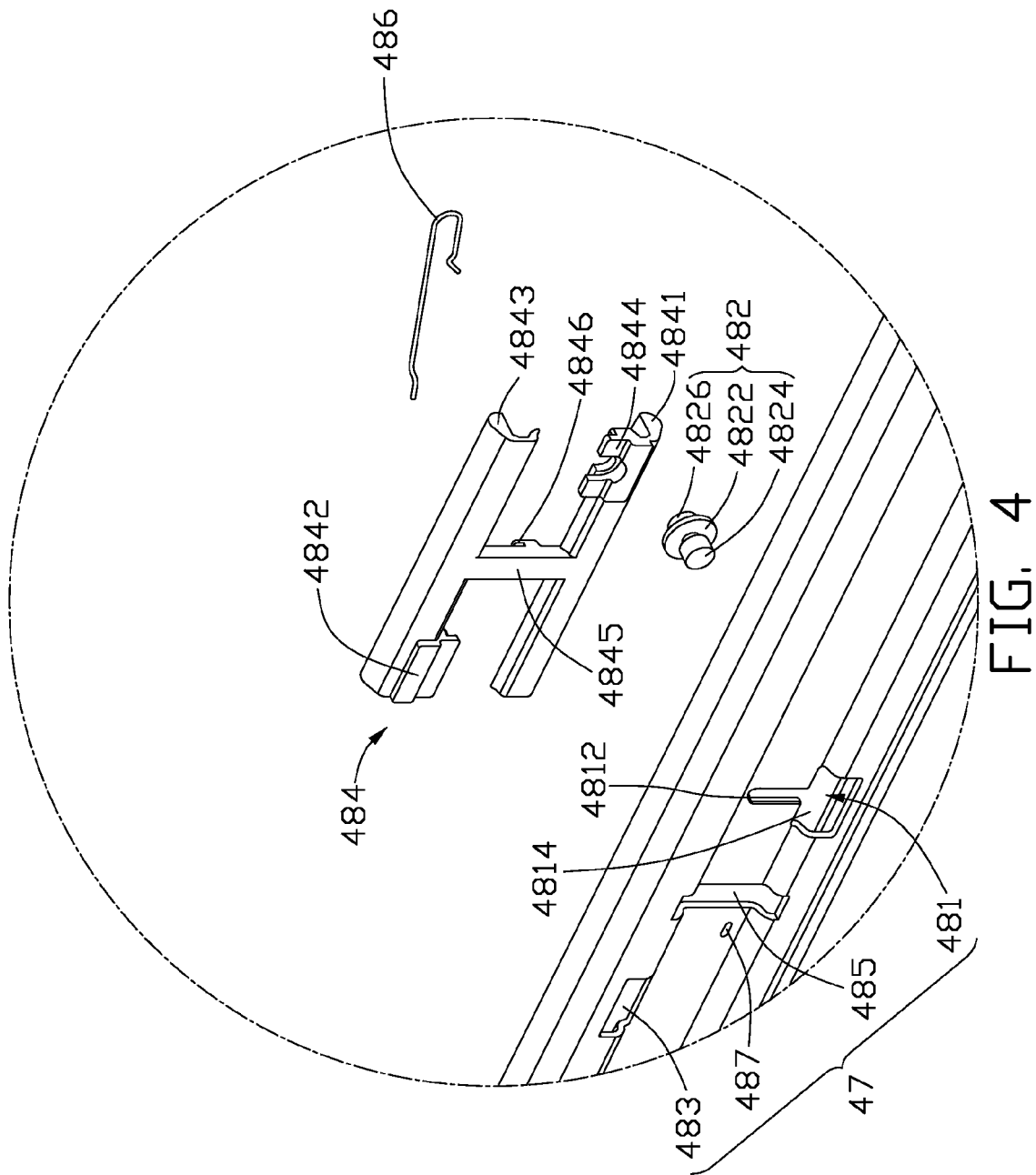

Referring to FIGS. 1 and 2, a first exemplary embodiment of a slide rail includes an outer rail 10, a releasing member 20, an intermediate rail 40, a first inner rail 50, a second inner rail 60, a first connecting mechanism 70, a second connecting mechanism 80, a first positioning mechanism 46, a second positioning mechanism 48, two slide facilitating members 30 slidably disposed between the outer rail 10 and the intermediate rail 40, two slide facilitating members 32 slidably disposed between the first inner rail 50 and the intermediate rail 40, two slide facilitating members 34 slidably disposed between the second inner rail 60 and the intermediate rail 40, and a latch member 90 for releasably locking the first connecting mechanism 70 and the second connecting mechanism 80.

The outer rail 10 includes a rail body 12 defining a C-shaped cross section, and two blocking members 14. The rail body 12 includes a sidewall, and top and bottom flanges respectively extending from top and bottom sides of the sidewall. First and second guiding tabs 126 and 128 protrude from the sidewall of the outer rail 10. The first guiding tab 126 is close to the top flange of the outer rail 10 and adjacent a first end of the outer rail 10. The first guiding tab 126 includes an arc-shaped guiding portion 1261 facing the bottom flange of the outer rail 10, and a stop portion 1262 extending towards the first end of the outer rail 10. The second guiding tab 128 is close to the bottom flange of the outer rail 10 and adjacent a second end opposite to the first end of the outer rail 10. The second guiding tab 128 includes an arc-shaped guiding portion 1281 facing the top flange of the outer rail 10, and a stop portion 1282 extending towards the second end of the outer rail 10.

Each blocking member 14 defines a C-shaped cross section, and includes two limiting portions 142 at a top and a bottom of the blocking member 14, respectively. The blocking members 14 abut against an inner surface of the outer rail 10 and are secured to the first and second ends of the outer rail 10. Therefore, the limiting portions 142 of each of the blocking members 14 are respectively close to the top and bottom flanges of the outer rail 10.

The releasing member 20 defines a substantially S-shaped cross section. The releasing member 20 includes a depressed portion 24 at an upper part of the releasing member 20, and a mounting portion 22 extending from a bottom of the depressed portion 24. A releasing portion 242 extends from a joint of the depressed portion 24 and the mounting portion 22. The releasing portion 242 forms a guiding edge 2421.

Referring to FIGS. 1-4, 9, and 10, the intermediate rail 40 includes a rail body 42 and two blocking members 44. The rail body 42 includes a sidewall, and top and bottom flanges extending from top and bottom sides of the sidewall of the rail body 42, respectively. An upper groove is defined between the sidewall and the top flange of the rail body 42, a lower groove is defined between the sidewall and the bottom flange of the rail body 42. The rail body 42 of the intermediate rail 40 further includes an engaging tab 429 perpendicularly extending from the sidewall of the rail body 42, a first attaching section 45, a second attaching section 47, a first positioning section 41, and a second positioning section 43 spacedly formed on the rail body 42 along a longitudinal direction of the rail body 42

The first attaching section 45 defines a retaining hole 463 communicating with the lower groove of the intermediate rail 40, a fixing hole 467 in the sidewall of the intermediate rail 40, a substantially rectangular receiving hole 465, and a substantially T-shaped guiding hole 461. The guiding hole 461 includes a great accessing portion 4614 communicating with the upper groove of the intermediate rail 40 and a small sliding portion 4612 in the sidewall of the rail body 42.

The second attaching section 47 includes a retaining hole 483 communicating with the upper groove of the intermediate rail 40, a fixing hole 487 in the sidewall of the intermediate rail 40, a substantially rectangular receiving hole 485, and a substantially T-shaped guiding hole 481. The guiding hole 481 includes a great accessing portion 4814 communicating with the lower groove of the intermediate rail 40 and a small sliding portion 4812 in the sidewall of the rail body 42.

The first positioning section 41 includes a locking portion 421 protruding from the sidewall of the rail body 42, and an accessing hole 422 defined in the sidewall of the rail body 42 and adjacent to the locking portion 421. The second positioning section 43 includes a locking portion 423 protruding from the sidewall of the rail body 42, and an accessing hole 424 defined in the sidewall of the rail body 42 and adjacent to the locking portion 423. The blocking members 44 are configured to abut against an inner surface of the rail body 42 and be fixed to opposite ends of the rail body 42. Each blocking member 44 forms two blocking portions 443 at opposite sides of the blocking member 44, the blocking portions 443 are received in the upper and lower grooves of the rail body 42.

Referring to FIG. 3 again, the first positioning mechanism 46 includes a button 462, a supporting member 464, and an elastic member 466. The button 462 includes two head portions 4624 and 4626 at opposite ends of the button 462, and a flange 4622 located between the head portions 4624 and 4626 and extending from a circumference of a middle of the button 462. Each of the head portions 4624 and 4626 includes a neck section connected to the flange 4622. The supporting member 464 is generally H-shaped, and includes a first supporting pole 4641, a second supporting pole 4643 parallel to the first supporting pole 4641, and a connecting pole 4645 perpendicularly connected between the first and second supporting poles 4641 and 4643. A substantially L-shaped hook 4646 extends from the connecting pole 4645. A fork portion 4644 is formed at an end of the second supporting pole 4643, facing the first supporting pole 4641 and defining a receiving space adapted to receive the button 462. A blocking tab 4642 protrudes from an end of the first supporting pole 4641 toward the second supporting pole 4643, opposite to the fork portion 4644. Therefore, the blocking tab 4642 and the fork portion 4644 are diagonally arranged at the supporting member 464. The elastic member 466 is substantially J-shaped, and includes a long arm and a short arm. A distal end of the long arm forms a catching portion. A distal end of the short arm is V-shaped, therefore a shrinking opening is defined between the distal end of the short arm and the long arm.

Referring to FIG. 4 again, the second positioning mechanism 48 is similar to the first positioning mechanism 46, and includes a button 482, a supporting member 484, and an elastic member 486. The button 482 includes two head portions 4824 and 4826 at opposite ends of the button 482, and a flange 4822 located between the head portions 4824 and 4826 and extending from a circumference of a middle of the button 482. Each of the head portions 4824 and 4826 includes a neck section connected to the flange 4822. The supporting member 484 is H-shaped, and includes a first supporting pole 4841, a second supporting pole 4843 parallel to the first supporting pole 4841, and a connecting pole 4845 perpendicularly connected between the first and second supporting poles 4841 and 4843. A substantially L-shaped hook 4846 extends from the connecting pole 4845. A fork portion 4844 is formed at an end of the first supporting pole 4841, facing the second supporting pole 4843 and defining a receiving space adapted to receive the button 482. A blocking tab 4842 protrudes from an end of the second supporting pole 4843, opposite to the fork portion 4844. Therefore, the blocking tab 4842 and the fork portion 4844 are diagonally arranged at the supporting member 484. The elastic member 486 is substantially J-shaped, and includes a long arm and a short arm. A distal end of the long arm forms a catching portion, and a distal end of the short arm is V-shaped.

Figure 5:
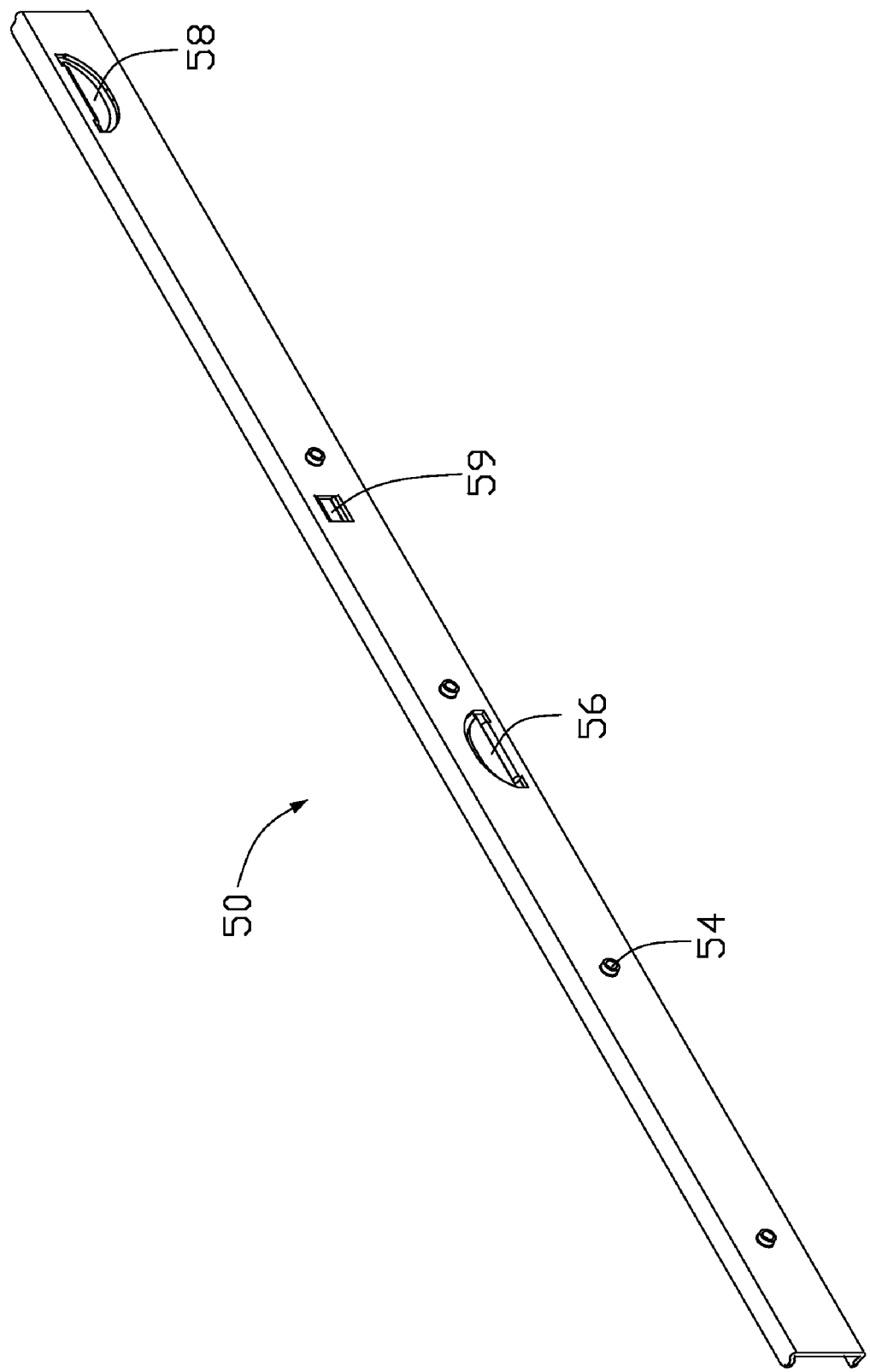
FIG. 5 is an enlarged, isometric view of the first inner rail of FIG. 1.

Referring to FIGS. 1, 2, and 5, the first inner rail 50 defines a C-shaped cross section, and includes a sidewall, and top and bottom flanges extending from top and bottom sides of the sidewall. The sidewall of the first inner rail 50 includes a first guiding protrusion 56 on a middle of the sidewall, a second guiding protrusion 58 adjacent to an end of the sidewall, a locking tab 59 between the first and second guiding protrusions 56 and 58, and a plurality of inner-threaded posts 54 along a longitudinal direction of the first inner rail 50. The first and second guiding protrusions 56 and 58 are substantially semicircular. The arc of the first guiding protrusion 56 faces the top flange of the first inner rail 50, and the arc of the second guiding protrusion 58 faces the bottom flange of the first inner rail 50.

Figure 7:
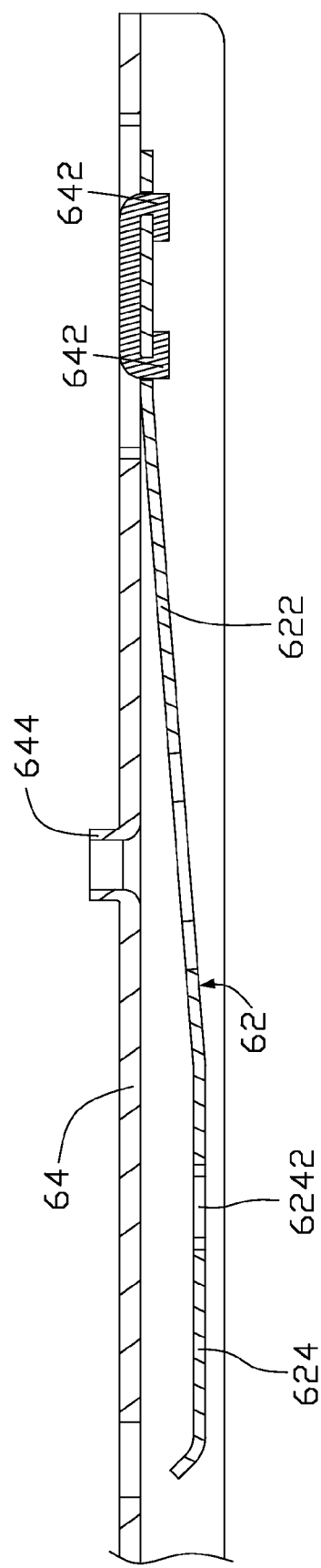
FIG. 7 is an assembled, cutaway view of the second inner rail of FIG. 1.

Referring to FIGS. 1, 2, and 7, the second inner rail 60 includes a rail body 64 and an elastic locking plate 62. The rail body 64 includes a plurality of posts 644 arranged along a longitudinal direction of the rail body 64, and a pair of securing ears 642 extending from an end of the rail body 64, opposite to the plurality of posts 644. The locking plate 62 includes a retaining portion 624 and a mounting portion 622 slantingly extending from a first end of the retaining portion 624. The retaining portion 624 forms a slanting guiding part at a second end opposite to the first end of the retaining portion 624. A pair of mounting holes is defined in the mounting portion 622 for securely engaging with the securing ears 642 of the rail body 64, thereby, fixing the locking plate 62 to the rail body 64. A locking hole 6242 is defined in the retaining portion 624.

Figure 6:
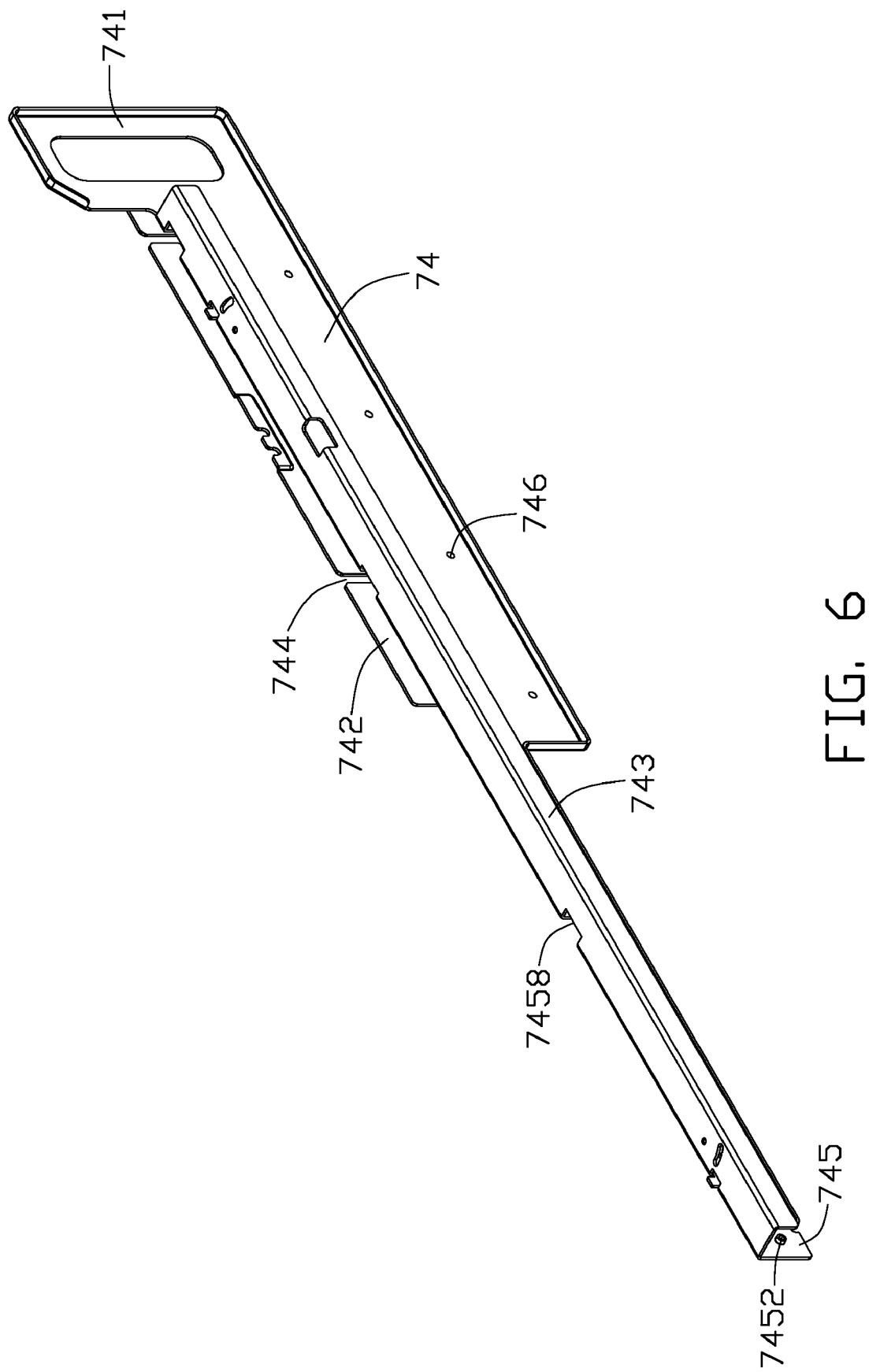
FIG. 6 is an enlarged, isometric view of the first connecting mechanism of FIG. 1, but viewed from another perspective.

Referring to FIGS. 1, 2, and 6, the first connecting mechanism 70 includes a connection member 72 and an attachment member 74. The connection member 72 defines a plurality of fixing holes 722, a plurality of n-shaped recessed areas, and a plurality of screw holes 724 arranged in bottoms of the corresponding recessed areas. The attachment member 74 includes an engaging section 742 at a first side of the attachment member 74, a handle 741 at a first end of the attachment member 74, an elongated portion 745 extending from a second end opposite to the first end of the attachment member 74, and a flange 743 disposed near the engaging section 742. The flange 743 has an L-shaped cross section, and includes a first end adjacent to the handle 741, and a second end opposite to the first end of the flange 743. A plurality of fixing holes 746 is defined in the attachment member 74 adjacent to a second side opposite to the engaging section 742. A protuberance 7452 protrudes from a distal end of the elongated portion 745, and located between the elongated portion 745 and the flange 743. An interference-avoiding hole 7458 is defined in a joint of the flange 743 and the elongated portion 745. A plurality of L-shaped mounting slots 744 is defined in the engaging section 742 and adapted to receive columns attached to a side surface of a first server, thereby, attaching the first server to the attachment member 74.

Figure 8:
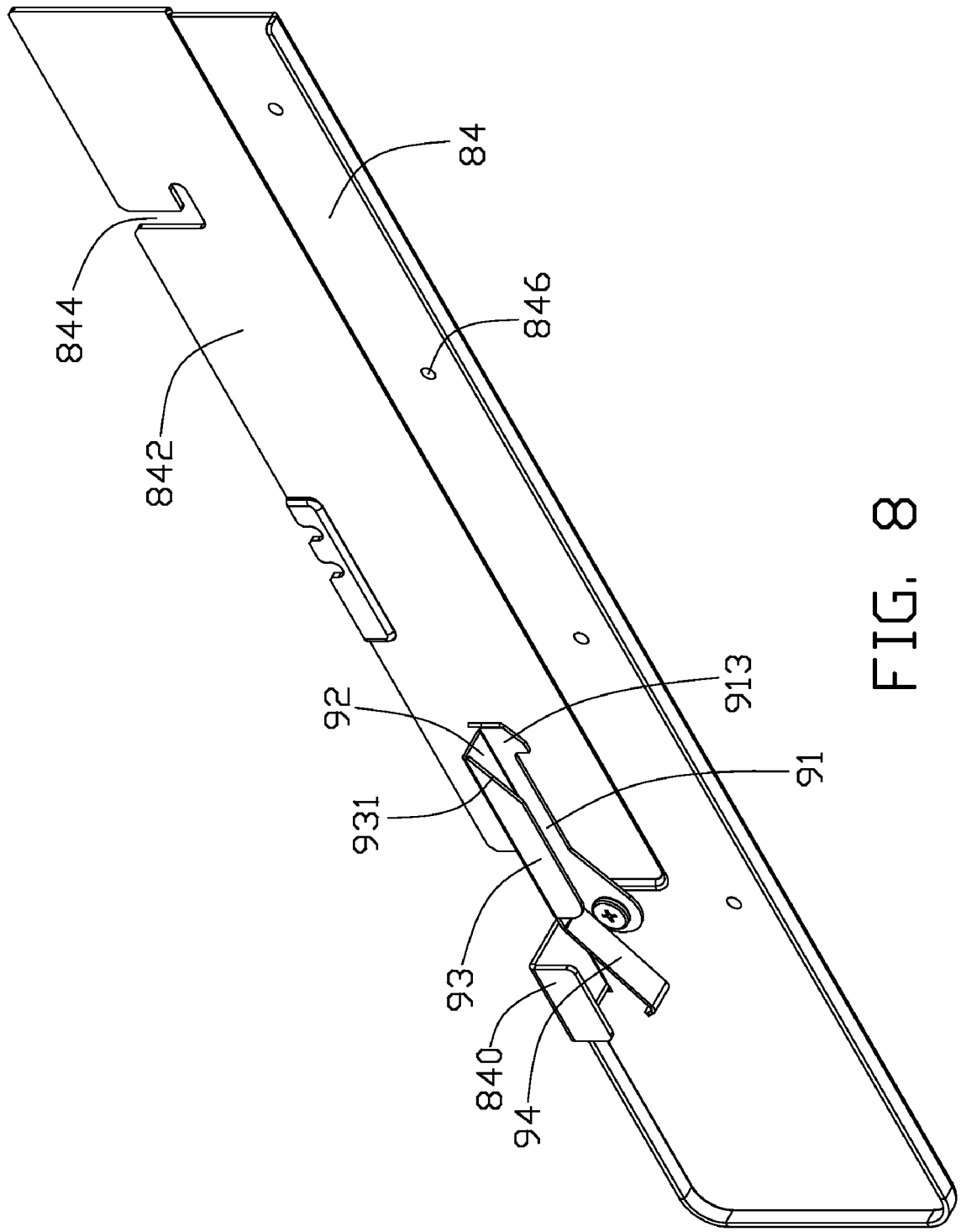
FIG. 8 is an assembled, enlarged view of the second connecting mechanism and the latch member of FIG. 1, but viewed from another perspective.
Figure 9:
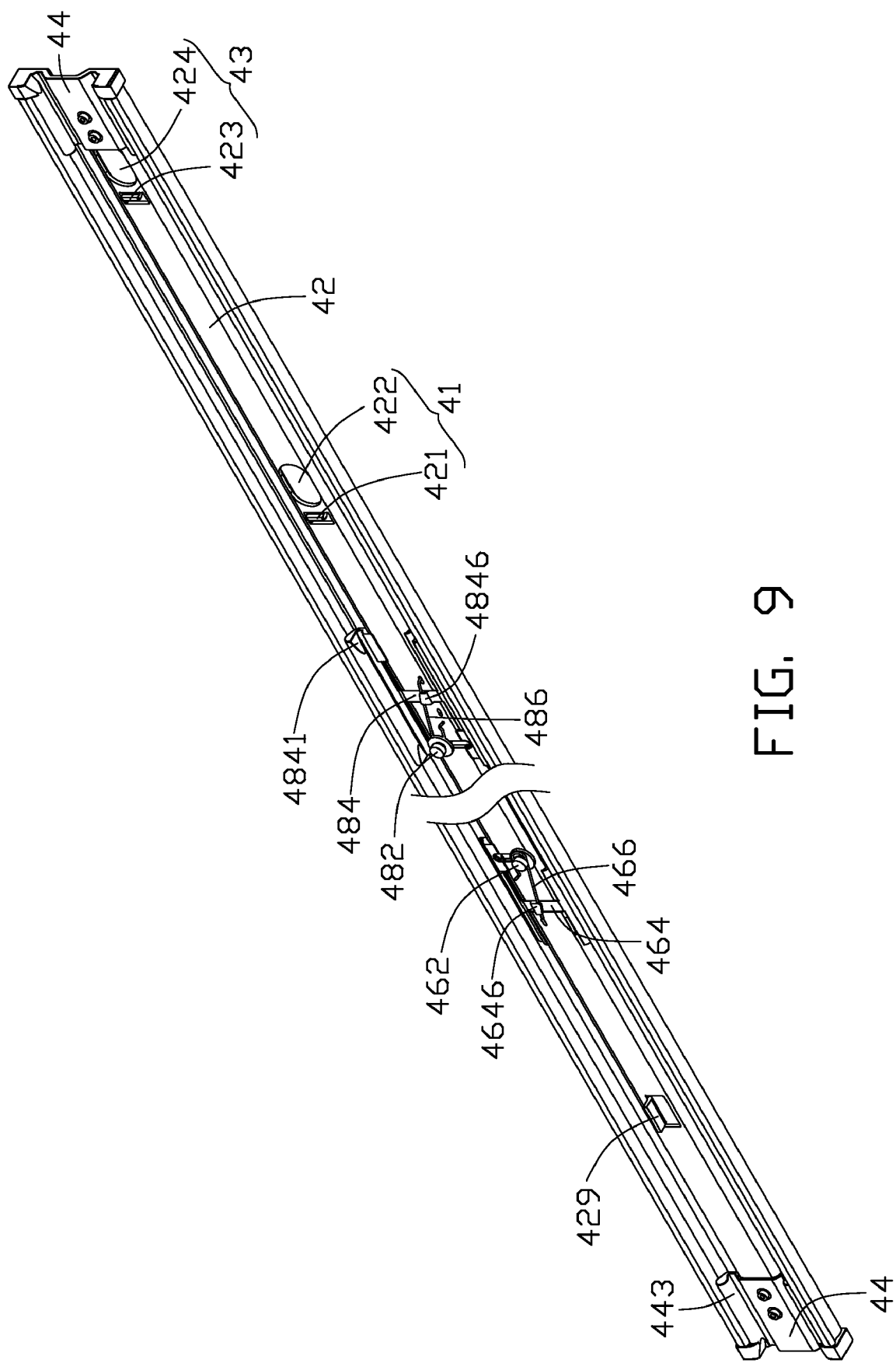
FIGS. 9 and 10 are partial, assembled, isometric views of the intermediate rail, and the first and second positioning mechanisms, but viewed from different perspectives.
Figure 10:
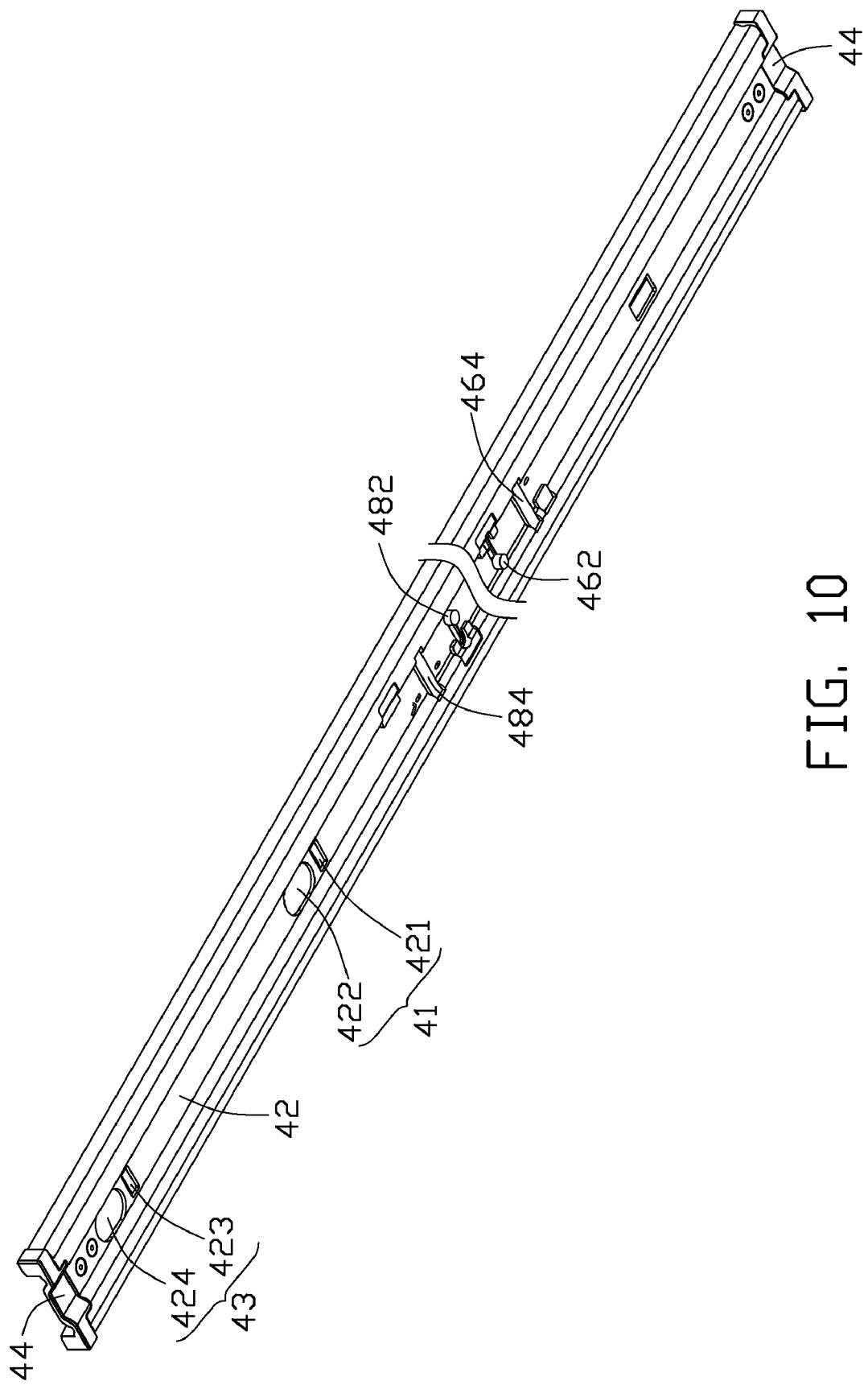
Figure 11:
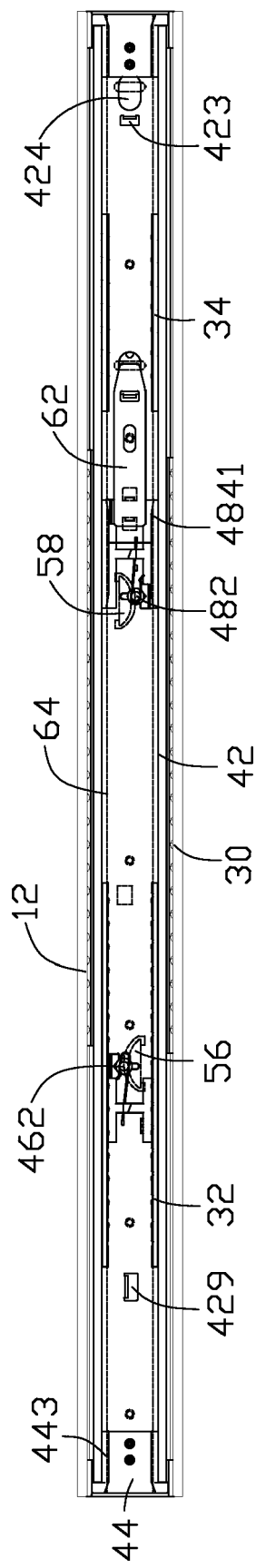
FIG. 11 is an assembled, front elevational view of the outer rail, the intermediate rail, the first inner rail, and the second inner rail of FIG. 1.
Figure 12:
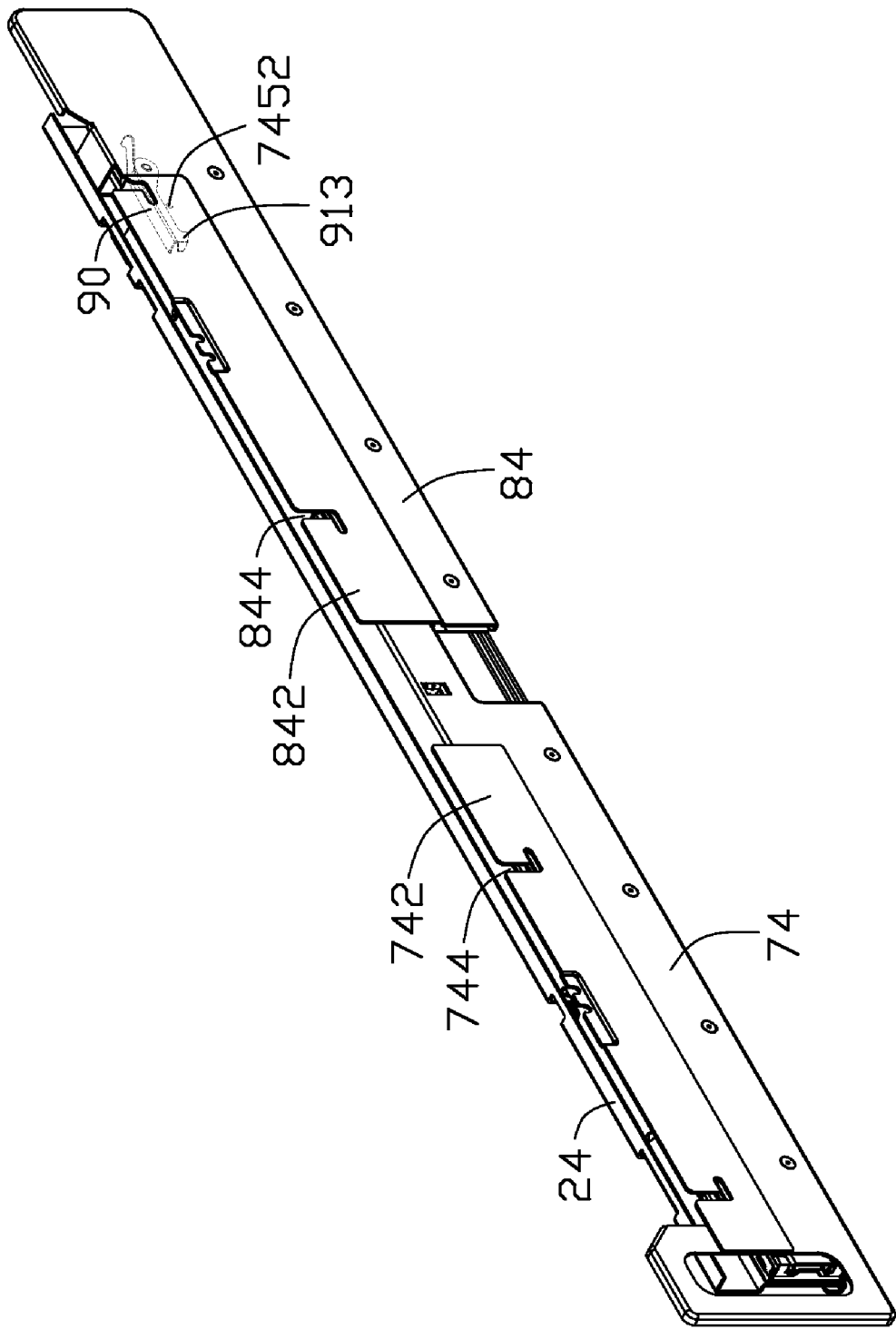
FIGS. 12 and 13 are assembled, isometric views of FIGS. 1 and 2.
Figure 13:
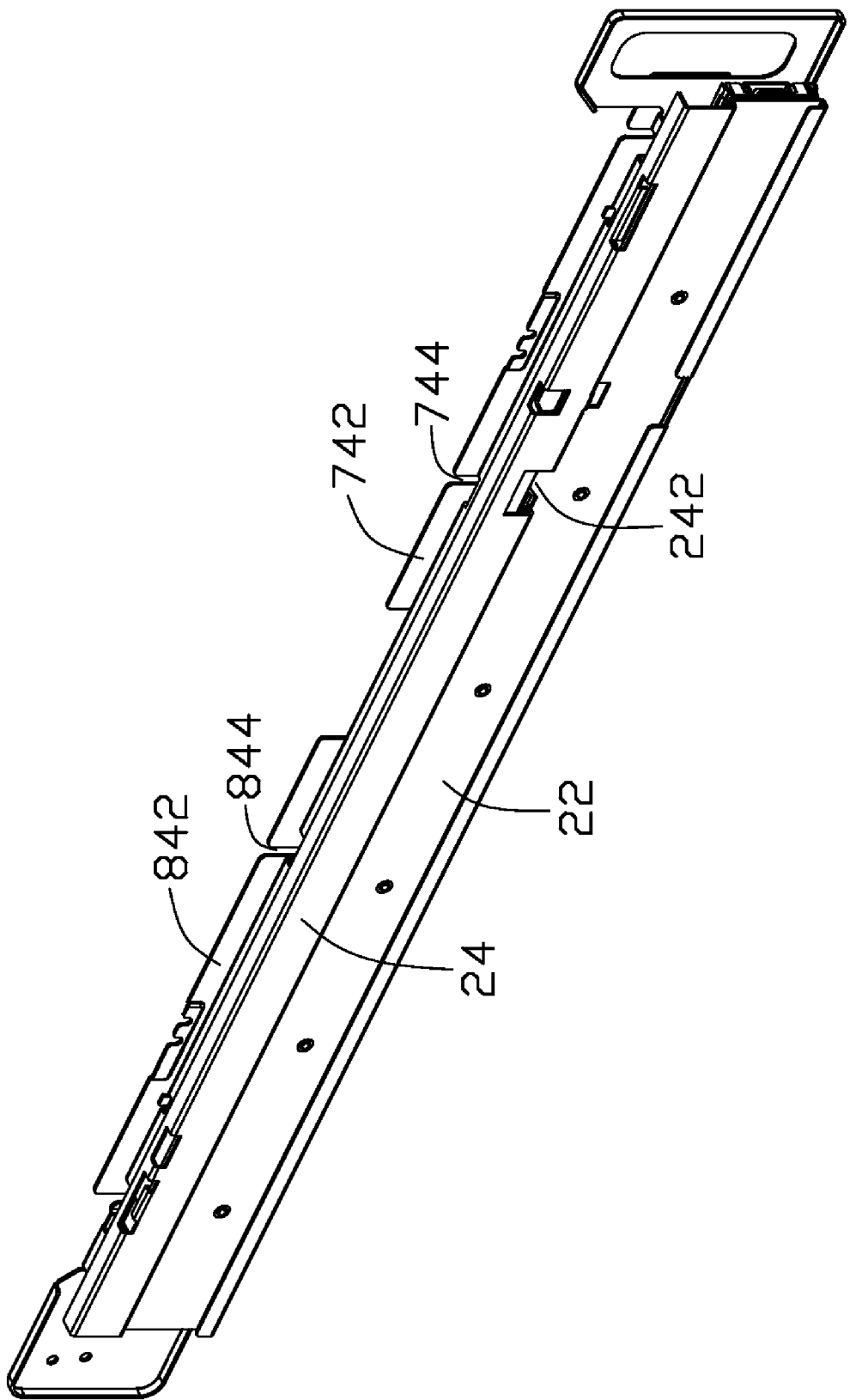
Figure 14:
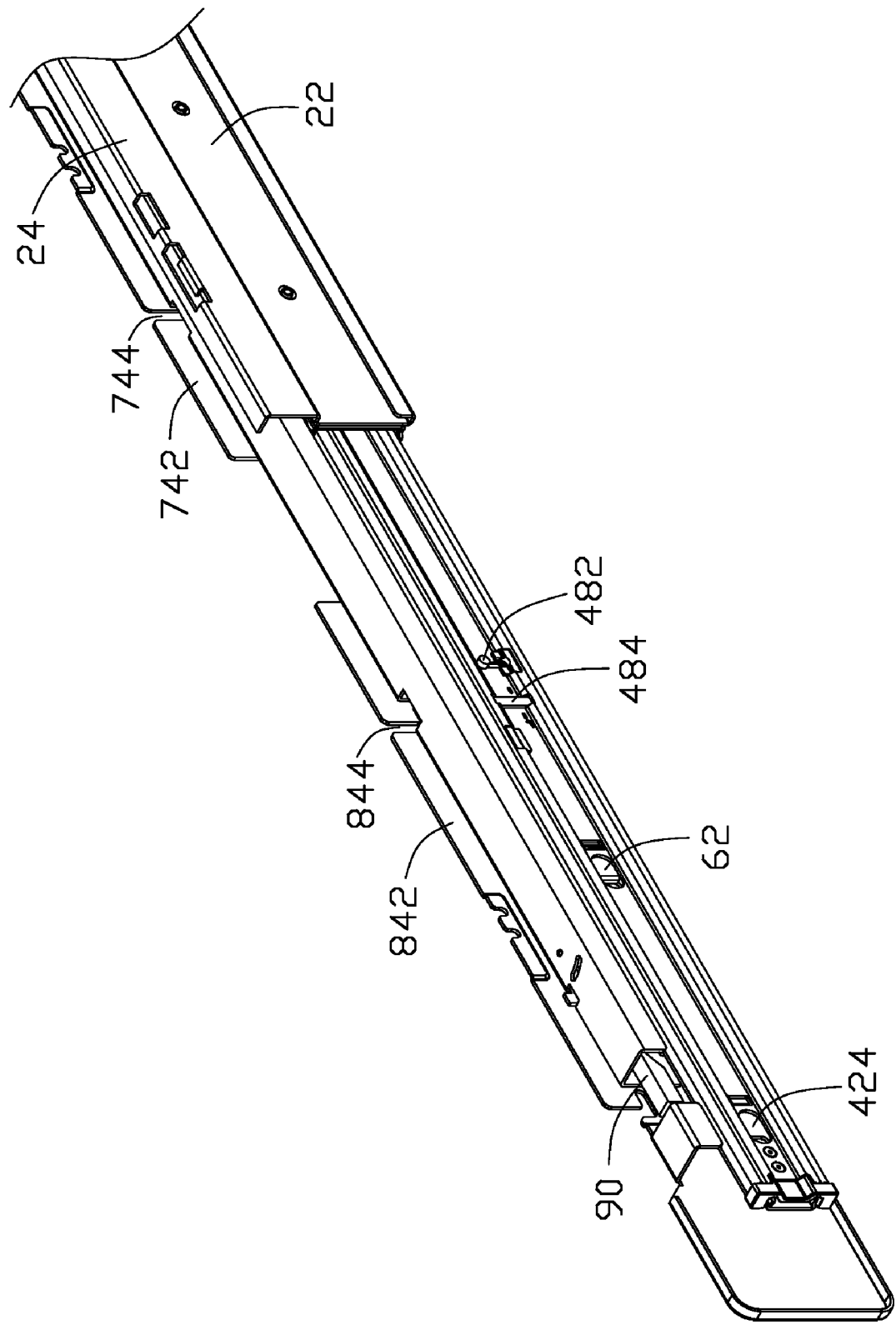
FIG. 14 is an enlarged, partial view of FIG. 12, but viewed from another perspective and showing a using state.
Figure 15:
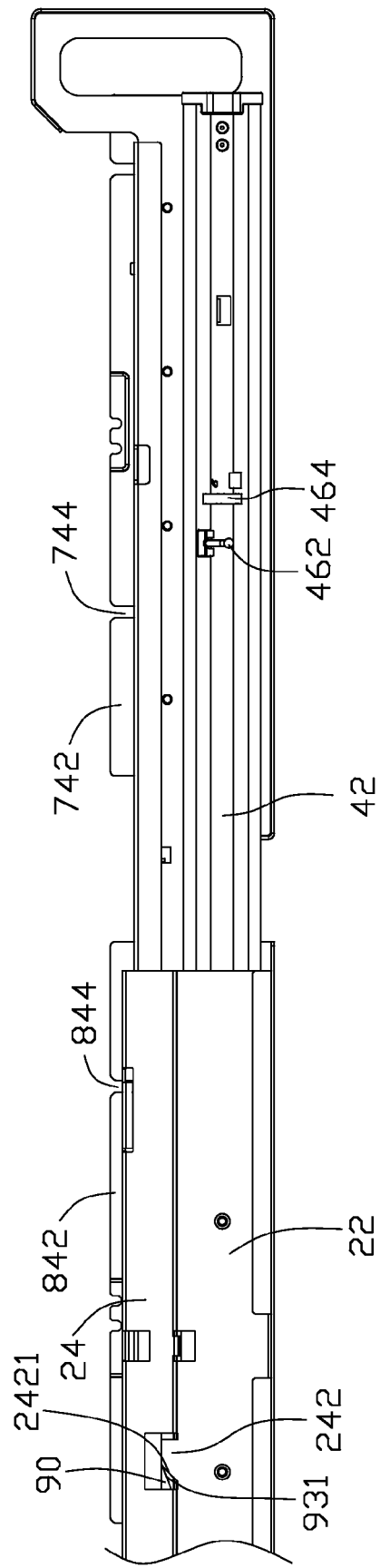
FIG. 15 is a partial, front elevational view of FIG. 14.
Figure 16:
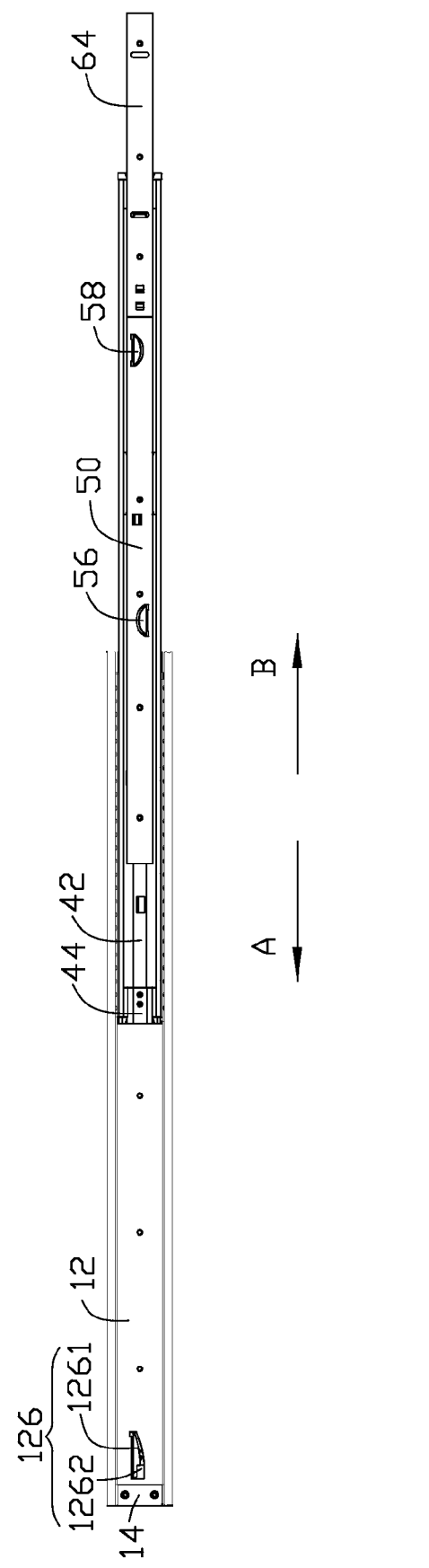
FIGS. 16 and 17 are similar to FIG. 11, but showing different using states.

Referring to FIGS. 1, 2, and 8, the second connecting mechanism 80 includes a connection member 82 and an attachment member 84. The connection member 82 defines a plurality of fixing holes 822, a plurality of n-shaped recessed areas, and a plurality of screw holes 824 arranged in bottoms of the recessed areas of the connection member 82. The attachment member 84 includes an engaging portion 842 at a first side and an L-shaped flange 840 near the engaging portion 842. A screw hole 841 is defined in the attachment member 84 adjacent to the flange 840. A plurality of fixing holes 846 is defined in the attachment member 84 adjacent to a second side opposite to the first side of the attachment member 84. A plurality of L-shaped mounting slots 844 is defined in the engaging section 842 and adapted to receive columns attached to a side surface of a second server, thereby, attaching the second server to the attachment member 84.

The latch member 90 includes a middle wall 92, a cantilevered resilient arm 94 slantingly extending from an end of the middle wall 92, and a latch portion 91 and an abutting wall 93 perpendicularly extending from opposite sides of the middle wall 92. The latch portion 91 defines a pivoting hole in a first end of the latch portion 91 near the resilient arm 94, and forms a hook 913 at a second end opposite to the first end of the latch portion 91. The abutting wall 93 forms a slanting edge 931 at an end of the abutting wall 93, opposite to the resilient arm 94.

Referring to FIGS. 1, 3, 9, and 10, to assemble the first positioning mechanism 46 to the intermediate rail 40, the button 462 of the first positioning mechanism 46 passes through the guiding hole 461 from the accessing portion 4614 of the intermediate rail 40. The neck section of the head portion 4624 is slid into the sliding portion 4612 of the guiding hole 461, and the flange 4622 of the button 462 abuts against the inner surface of the rail body 42 of the intermediate rail 40. The fork portion 4644 and the blocking tab 4642 are respectively engaged in the accessing portion 4614 of the guiding hole 461 and the retaining hole 463 of the rail body 42. The connecting pole 4645 is received in the receiving hole 465 of the rail body 42. Thus, the supporting member 464 is secured to the rail body 42. The receiving space of the fork portion 4644 aligns with the sliding portion 4612. Thus, the button 462 is limited to slide in the sliding portion 4612 and the receiving space of the fork portion 4644 of the supporting member 464. The long arm and short arm of the elastic member 466 sandwich the neck section of the head portion 4626 of the button 462 therebetween. The shrinking opening of the elastic member 466 can prevent the button 462 from disengaging from the elastic member 466. The catch portion of the long arm of the elastic member 466 is engaged in the fixing hole 467 of the intermediate rail 40, and the long arm of the elastic member 466 is engaged with the hook 4646 of the supporting member 464. The elastic member 466 can bias the button 462 toward an end of the sliding portion 4612 opposite to the accessing portion 4614.

Referring to FIGS. 1, 4, 9 and 10, to assemble the second positioning mechanism 48 to the intermediate rail 40, the button 482 of the second positioning mechanism 48 passes through the guiding hole 481 from the accessing portion 4814, the neck section of the head portion 4824 is slid into the sliding portion 4812 of the guiding hole 481. The flange 4822 of the button 482 abuts against the inner surface of the rail body 42 of the intermediate rail 40. The supporting member 484 is secured to the rail body 42 with the fork portion 4844 and the blocking tab 4842 respectively engaged in the accessing portion 4814 of the guiding hole 481 and the retaining hole 483 of the rail body 42. The connecting pole 4845 is received in the receiving hole 485 of the rail body 42. The long arm and the short arm of the elastic member 486 sandwich the neck section of the head portion 4826 of the button 482 therebetween. The elastic member 486 is attached to the rail body 42 with the catch portion of the elastic member 486 retained in the fixing hole 487, and the long arm of the elastic member 486 is engaged with the hook 4846 of the supporting member 484. The elastic member 486 can bias the button 482 toward an end of the sliding portion 4812 of the guiding hole 481 opposite to the accessing portion 4814.

Referring to FIGS. 1-13, in assembly, the intermediate rail 40 is slidably attached to the outer rail 10. One of the two slide facilitating members 30 is sandwiched between the top flanges of the outer rail 10 and the intermediate rail 40, the other slide facilitating member 30 is sandwiched between the bottom flanges of the outer rail 10 and the intermediate rail 40. The two slide facilitating members 30 align with the corresponding limiting portions 142 of the blocking members 14. The first and second inner rails 50 and 60 are slidably attached to the intermediate rail 40 from opposite ends of the intermediate rail 40, opposite to the outer rail 10. The slide facilitating members 32 are slidably received in the upper and lower grooves of the intermediate rail 40. One of the slide facilitating members 32 is sandwiched between the top flanges of the first inner rail 50 and the intermediate rail 40, the other slide facilitating member 32 is sandwiched between the bottom flanges of the first inner rail 50 and the intermediate rail 40. By an installation way similar to the aforementioned way of mounting the slide facilitating members 32, the slide facilitating members 34 are slidably received in the upper and bottom grooves of the intermediate rail 40 and sandwiched between the second inner rail 60 and the intermediate rail 40.

When the first and second inner rails 50, 60 are fully retracted into the intermediate rail 40, the first guiding protrusion 56 of the first inner rail 50 resists against the head portion 4626 of the button 462, to drive the button 462 to slide towards the accessing portion 4614 along the sliding portion 4612 of the guiding hole 461 in response to the first inner rail 50 moving towards the second inner rail 60 further. Therefore, the elastic member 466 is deformed. The second guiding protrusion 58 of the first inner rail 50 resists against the head portion 4826 of the button 482, to drive the button 482 to slide towards the accessing portion 4814 along the sliding portion 4812 of the guiding hole 481. Therefore, the elastic member 486 is deformed. The locking portion 421 of the intermediate rail 40 is engaged in the locking hole 6242 of the locking plate 62 of the second inner rail 60.

The latch member 90 is pivotably mounted to the attachment member 84 with a screw (not labeled) pivotably received in the pivoting hole of the latch member 90 and engaged in the screw hole 841 of the attachment member 84. The resilient arm 94 of the latch member 90 is located under the flange 840 of the attachment member 84.

The connection member 72 is attached to the first inner rail 50 opposite to the intermediate rail 40, via screws passing through the fixing holes 722 of the connection member 72 and engaging in the posts 54 of the first inner rail 50. The attachment member 74 is connected to the connection member 72 opposite to the first inner rail 50, via screws passing through the fixing holes 746 of the attachment member 74 and engaging in the screw holes 724 of the connection member 72. Therefore, the connection member 72 is sandwiched between the first inner rail 50 and the attachment member 74.

The connection member 82 is attached to the second inner rail 60 opposite to the intermediate rail 40, via screws passing through the fixing holes 822 of the connection member 82 and engaging in the posts 644 of the second inner rail 60. The attachment member 84 is connected to the connection member 82 opposite to the second inner rail 60, via screws passing through the fixing holes 846 of the attachment member 84 and engaging in the screw holes 824 of the connection member 82. Therefore, the connection member 82 is sandwiched between the second inner rail 60 and the attachment member 84, and abuts against a side surface attached with the latch member 90 of the attachment member 84. A distal end of the resilient arm 94 of the latch member 90 resists against the top flange of the outer rail 10. When the slide rail is in a fully retracted state, the elongated portion 745 of the attachment member 74 abuts against the attachment member 84, and is disposed above the connection member 82. The interference-avoiding hole 7458 of the attachment member 74 aligns with one of the mounting slots 844 of the attachment member 84. The latch portion 91 of the latch member 90 is located under the flange 743 of the attachment member 74. The hook 913 of the latch portion 91 aligns with the protuberance 7452 of the attachment member 74, but spaced from the protuberance 7452.

The releasing member 20 is secured to an outer surface of the outer rail 10 opposite to the intermediate rail 40, via means of screwing. The flange 743 of the attachment member 74 and a part of the abutting wall 93 of the latch member 90 is slidably received in the depressed portion 24 of the releasing member 20.

Referring to FIGS. 14 to 17, in use, the slide rail is installed in a rack, and the first and second inner rails 50 and 60 are configured to mount the first and second servers, therefore, the first and second servers can be back-to-back mounted in the rack. When the first server mounted to the first inner rail 50 is required to be drawn out of the rack for maintenance, the handle 741 of the attachment member 74 of the first connecting mechanism 70 is operated in a first direction (indicated by arrow A in FIG. 17) away from the second inner rail 50. The first inner rail 50 is moved together with the attachment member 74. The first and second guiding protrusions 56 and 58 of the first inner rail 50 are disengaged from the buttons 462 and 482, therefore, the elastic members 466 and 486 are restored to bias the corresponding buttons 462 and 482 to slide along the sliding portions 4612 and 4812 of the corresponding guiding holes 461 and 481 away from the corresponding accessing portions 4614 and 4814. The first connecting mechanism 70 is moved away from the second connecting mechanism 80, until the protuberance 7452 of the attachment member 74 abuts against the hook 913 of the latch member 90.

The handle 741 of the attachment member 74 of the first connecting mechanism 70 is further moved in the first direction, therefore, the second connecting mechanism 80, and the second inner rail 60 secured to the second attachment member 82 of the second connecting mechanism 80 move with the first inner rail 50. The intermediate rail 40 slides synchronously with the second inner rail 60 because of the locking portion 421 of the intermediate rail 40 being engaged in the locking hole 6242 of the locking plate 62 of the second inner rail 60. With the intermediate rail 40 sliding related to the outer rail 10, the first button 462 passes by the first guiding tab 126 of the outer rail 10; then the second button 482 slides on the guiding portion 1261 of the first guiding tab 126, until the head portion 4824 of the second button 482 is passed by the guiding portion 1261 to engage with the stop portion 1262 of the first guiding tab 126. Therefore, the intermediate rail 40 is prevented from retracting back into the outer rail 10 accidently. When the latch member 90 slides with the first attachment 74 to a position shown in FIG. 15, the slanting edge 931 of the abutting wall 93 of the latch member 90 abuts against and slides on the guiding edge 2421 of the releasing portion 242 of the releasing member 20. The latch member 90 is pivoted around the releasing portion 242, thereby the hook 913 of the latch member 90 is disengaged from the protuberance 7452 of the attachment member 74. The resilient arm 94 of the latch member 90 resists against the top flange of the outer rail 10 and is deformed.

When the slide facilitating members 30 respectively abut against the limiting portions 142 of the blocking member 14 at the first end of the outer rail 10, the intermediate rail 40 is prevented from sliding further, avoiding to disengage from the outer rail 10. The second inner rail 60 is stopped, but the first inner rail 50 can continue to slide, until the locking tab 59 of the first inner rail 50 abut against the engaging tab 429 of the intermediate rail 40. The first server is entirely extended out of the rack, and kept a distance from the second server.

Therefore, the first server is ready for maintenance, which includes maintenance of the connection between the first and second server.

Figure 17:
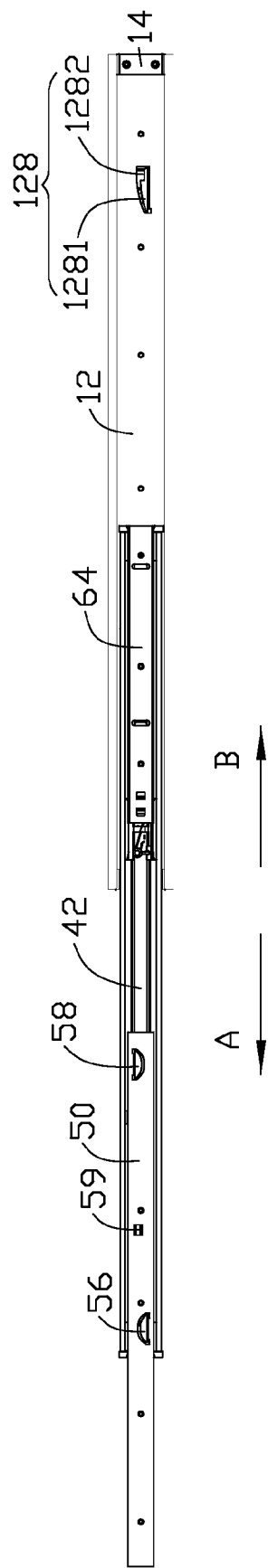

To retract the first and second servers back into the rack, the handle 741 of the attachment member 74 is driven in a second direction (opposite to the first direction and indicated by arrow B in FIG. 17). The first inner rail 50 is moved together with the attachment member 74. When the first inner rail 50 is fully retracted into the intermediate rail 40, the first and second guiding protrusions 56 and 58 of the first inner rail 50 resist against the head portions 4626 and 4628 of the buttons 462 and 482, respectively. The buttons 462 and 482 are urged to slide along the sliding portions 4612 and 4812 towards the accessing portions 4614 and 4814 of the corresponding guiding holes 461 and 481, therefore, the head portion 4824 of the button 482 disengages from the stop portion 1262 of the first guiding tab 126. The intermediate rail 40 slides to retract into the outer rail 10, until the first and second server are totally received in the rack. The second inner rail 60 slides with the intermediate rail 40 because of the locking portion 421 of the intermediate rail 40 being engaged in the locking hole 6242 of the locking plate 62 of the second inner rail 60, therefore, the latch member 90 is disengaged from the releasing portion 242, and is urged to pivot back by the restoring force of the resilient arm 94.

When the second server is required to be drawn out of the rack for maintenance, the attachment member 84 is driven in the second direction (indicated by arrow B in FIG. 16) to move away from the handle 741 of the attachment member 74. The second inner rail 60 is moved together with the attachment member 84. The intermediate rail 40 slides synchronously with the second inner rail 60 because of the locking portion 421 of the intermediate rail 40 being engaged in the locking hole 6242 of the locking plate 62 of the second inner rail 60. The buttons 462 and 482 of the intermediate rail 40 are disengaged from the first and second guiding protrusions 56 and 58, therefore the elastic members 466 and 486 restore to bias the buttons 462 and 482 to slide along the sliding portions 4612 and 4812 away from the accessing portions 4614 and 4814 of the corresponding guiding holes 461 and 481. The second connecting mechanism 80 moves away from the first connecting mechanism 70, until the hook 913 of the latch member 90 abuts against the protuberance 7452 of the attachment member 74.

The attachment member 84 of the second connecting mechanism 80 is further moved in the second direction, therefore, the first connecting mechanism 70, and the first inner rail 50 secured to the attachment member 72 of the first connecting mechanism 70 move with the second inner rail 60. With the intermediate rail 40 sliding related to the outer rail 10, the second button 482 passes by the second guiding tab 128 of the outer rail 10; then the first button 462 slides on the guiding portion 1281 of the second guiding tab 128, until the head portion 4624 of the first button is passed by the guiding portion 1281 to engage with the stop portion 1282 of the second guiding tab 128. Therefore, the intermediate rail 40 is prevented from retracting back into the outer rail 10 accidently.

When the facilitating members 30 abut against the limiting portions 142 of the blocking member 14 at the second end of outer rail 10, the intermediate rail 40 is prevented from sliding further, avoiding to disengage from the outer rail 10. A tool or a user's finger can extend through the accessing hole 422 of the intermediate rail 40 to drive the retaining portion 624 of the locking plate 62. Therefore, the locking portion 421 of the intermediate rail 40 is disengaged from the locking hole 6242 of the locking plate 62. The second inner rail 60 can slide further to a position shown in FIG. 16, wherein the locking portion 423 of the intermediate rail 40 is engaged in the locking hole 6242 of the locking plate 62 of the second inner rail 60. The second server is entirely extended out of the rack, and ready for maintenance.

To retract the second server back into the rack, a tool or a user's finger can extend through the accessing hole 424 of the intermediate rail 40 to drive the retaining portion 624 of the locking plate 62, therefore the locking portion 423 of the intermediate rail 40 is disengaged from the locking hole 6242 of the locking plate 62. The attachment member 84 is driven in the first direction toward the first inner rail 50. The second inner rail 60 is moved together with the attachment member 84, until abutting against the first inner rail 50. The attachment member 84 is moved further, the first inner rail 50 is driven by the second inner rail 60 to slide in the first direction. When the first and second inner rails 50 and 60 are fully retracted into the intermediate rail 40, the first and second guiding protrusions 56 and 58 of the first inner rail 50 resist against the head portions 4626 and 4826 of the buttons 462 and 482, respectively. The buttons 462 and 482 are urged to slide along the sliding portion 4612 and 4812 towards the accessing portions 4614 and 4814 of the corresponding guiding holes 461 and 481, therefore, the head portion 4624 of the button 462 is disengaged from the stop portion 1282 of the second guiding tab 128 of the outer rail 10. The intermediate rail 40 can slide to retract into the outer rail 10, and the first and second servers are totally received in the rack.

Figure 18:
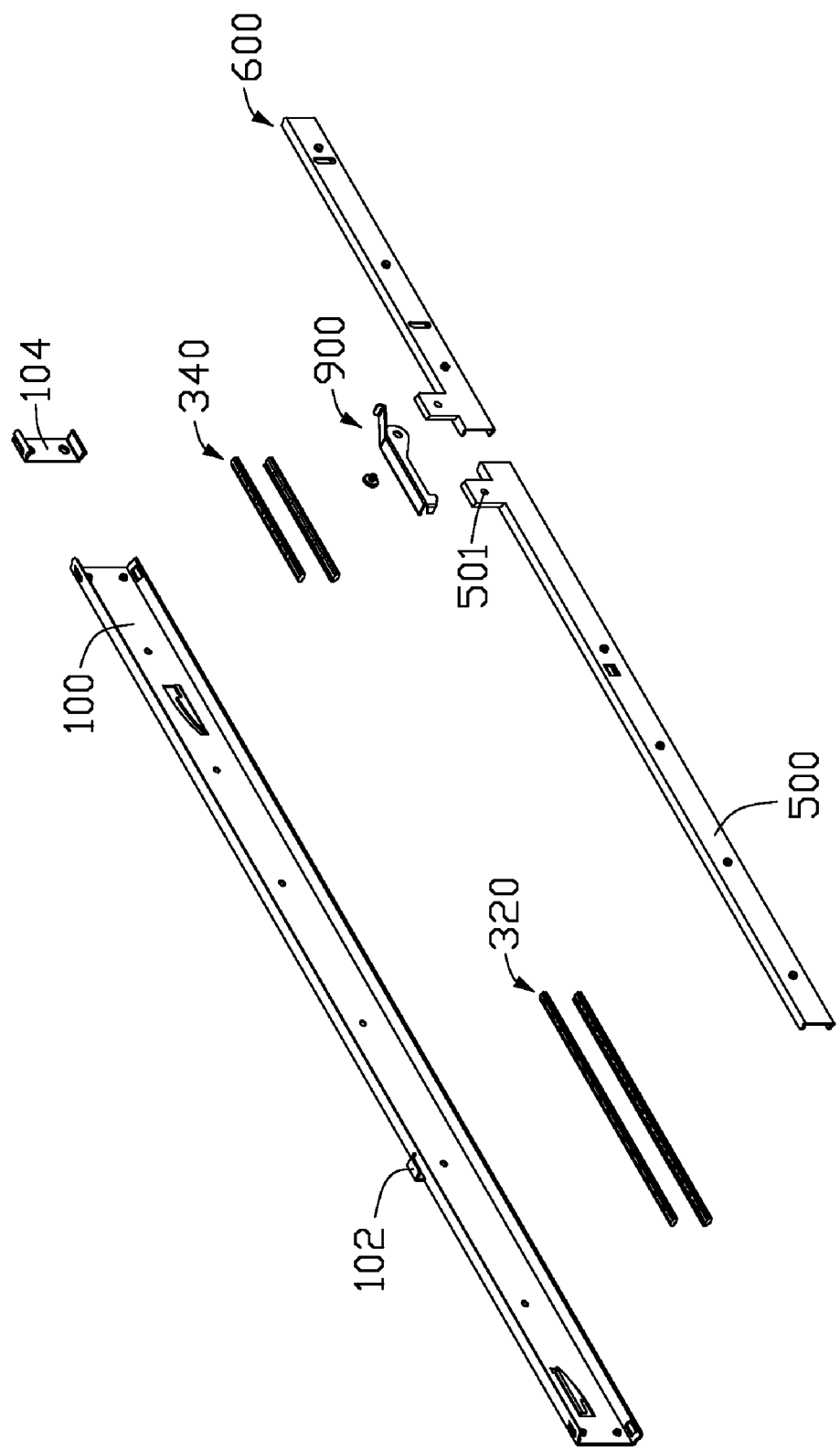
FIG. 18 is an exploded, isometric view of a second exemplary embodiment of a slide rail.

Referring to FIG. 18, a second embodiment of a slide rail includes an outer rail 100, a first inner rail 500, a second inner rail 600, and a latch member 900. Two slide facilitating members 320 are sandwiched between the outer rail 100 and the first inner rail 500. Two slide facilitating members 340 are sandwiched between the outer rail 100 and the second inner rail 600. The outer rail 100 includes a releasing portion 102. The first inner rail 500 includes a protuberance 501 protruding from an end of the first inner rail 500. The latch member 900 is similar to the latch member 90 of the first embodiment, and pivotably attached to an end of the second inner rail 600 adjacent to the first inner rail 500. The latch member 900 can be engaged with the protuberance 501.

In use, the outer rail 100 is configured to be attached to an inner surface of a rack. Two servers are respectively connected to the first and second inner rails 500 and 600, and capable of being received in the rack when the first and second inner rails 500 and 600 are retracted into the outer rail 100. When the first inner rail 500 is drawn out of the outer rail 100, the latch member 900 abuts against the releasing portion 102 and is urged to pivot to disengage from the protuberance 501 of the first inner rail 500. Therefore, the first inner rail 500 can move a distance away from the second inner rail 600 to facilitate the maintenance of the first and second servers.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A slide rail comprising:
an outer rail;
a first inner rail slidably telescopically mounted to the outer rail, and arranged adjacent to a first end of the outer rail;
a second inner rail slidably telescopically mounted to the outer rail, and arranged adjacent to a second end opposite to the first end of the outer rail;
a first connecting mechanism including a connection member and an attachment member, with the connection member being attached to the first inner rail;
a protuberance disposed on the attachment member of the first connecting mechanism;
a second connecting mechanism including a connection member and an attachment member, with the connection member being attached to the second inner rail;
a latch member pivotally connected to the attachment member of the second connecting mechanism, and capable of engaging with or disengaging from the protuberance; and
a releasing member connected to the outer rail and forming a releasing portion;
wherein when the first inner rail slides out of the outer rail from the first end, the releasing portion is configured to abut against the latch member and urge the latch member to disengage from the protuberance.

2. The slide rail of claim 1, further comprising an intermediate rail slidably received in the outer rail, wherein the first and second inner rails are slidably received in the intermediate rail.

3. The slide rail of claim 2, wherein the latch member comprises a hook and a resilient arm resisting against the outer rail for biasing the latch member and enabling the hook to engage with the protuberance.

4. The slide rail of claim 3, wherein the latch member further comprises an abutting wall, the releasing portion of the releasing member abuts against the abutting wall to pivot the latch member.

5. The slide rail of claim 4, wherein the releasing portion forms a guiding edge, the abutting wall forms a slanting edge configured to abut against and slide on the guiding edge, therefore the latch member is pivoted and the hook of the latch member is disengaged from the protuberance.

6. The slide rail of claim 2, wherein the second inner rail comprises a rail body, and a locking plate extending from the rail body, the locking plate defines a locking hole, a locking portion extends from the intermediate rail to be engaged in the locking hole of the locking plate to prevent a relative sliding of the second inner rail and the intermediate rail.

7. The slide rail of claim 6, wherein the intermediate rail defines an accessing hole near the locking portion, to expose the locking plate for driving the locking plate to disengage from the locking portion.

8. The slide rail of claim 2, further comprising a pair of slide facilitating members slidably sandwiched between the intermediate rail and the outer rail, wherein the outer rail comprises a pair of blocking members at opposite ends of the outer rail to abut against the pair of slide facilitating members, thereby preventing the intermediate rail from sliding out of the outer rail.

9. The slide rail of claim 2, further comprising a pair of first slide facilitating members slidably sandwiched between the first inner rail and the intermediate rail, and a pair of second slide facilitating members slidably sandwiched between the second inner rail and the intermediate rail, wherein the intermediate rail comprises a pair of blocking members disposed at opposite ends of the intermediate rail to abut against the pair of first slide facilitating members and the pair of second slide facilitating member, thereby preventing the first and second inner rails from sliding out of the intermediate rail.

10. The slide rail of claim 2, wherein the outer rail further comprises at least one guiding tab, the intermediate rail further comprises at least one positioning mechanism, said at least one positioning mechanism is capable of being blocked by said at least one guiding tab to prevent the intermediate rail from retracting into the out rail in response to the intermediate rail extending from the out rail.

11. The slide rail of claim 10, wherein the first inner rail comprises at least one guiding protrusion, to drive said at least one positioning mechanism of the intermediate rail to disengage from said at least one guiding tab.

12. The slide rail of claim 11, wherein said at least one positioning mechanism comprises an elastic member and a button, a first end of the elastic member is connected to the intermediate rail, and a second end of the elastic member is connected to the button, the button is capable of being biased by the elastic member to abut against said at least one guiding tab.

13. The slide rail of claim 12, wherein the intermediate rail defines a guiding hole to slidably receive the button, the elastic member is capable of biasing the button to slide toward a first end of the guiding hole, thereby driving the button to abut against said at least one guiding tab.

14. The slide rail of claim 13, wherein the each of the at least one guiding protrusion comprises a guiding part to drive the button to slide toward a second end opposite to the first end of the guiding hole to distort the elastic member, in response to the first inner rail slides into the intermediate rail.

* * * * *